United States Patent
Gaind et al.

(10) Patent No.: US 11,415,531 B2
(45) Date of Patent: Aug. 16, 2022

(54) STATISTICAL LEARNING-BASED MODE SELECTION FOR MULTI-MODE INSPECTION

(71) Applicant: KLA Corporation, Milpitas, CA (US)

(72) Inventors: Vaibhav Gaind, Fremont, CA (US); Bjorn Brauer, Beaverton, OR (US)

(73) Assignee: KLA Corp., Milpitas, CA (US)

( * ) Notice: Subject to any disclaimer, the term of this patent is extended or adjusted under 35 U.S.C. 154(b) by 255 days.

(21) Appl. No.: 16/883,794

(22) Filed: May 26, 2020

(65) Prior Publication Data

US 2021/0109041 A1 Apr. 15, 2021

Related U.S. Application Data

(60) Provisional application No. 62/914,358, filed on Oct. 11, 2019.

(51) Int. Cl.
*G06T 7/00* (2017.01)
*G01N 21/88* (2006.01)
*G01N 21/95* (2006.01)
*G01N 23/20* (2018.01)
(Continued)

(52) U.S. Cl.
CPC ......... *G01N 23/20* (2013.01); *G01N 21/9505* (2013.01); *G03F 7/7065* (2013.01); *G03F 7/70616* (2013.01); *G06T 7/0004* (2013.01); *G01N 2021/8883* (2013.01); *G01N 2223/05* (2013.01); *G06T 2207/30148* (2013.01); *H01L 22/20* (2013.01)

(58) Field of Classification Search
CPC ....... G01N 2021/8883; G01N 21/9505; G01N 2223/05; G01N 23/20; G03F 7/70616; G03F 7/7065; G06T 2207/30148; G06T 7/0004; H01L 22/20
See application file for complete search history.

(56) References Cited

U.S. PATENT DOCUMENTS

| | | | |
|---|---|---|---|
| 7,676,077 B2 | 3/2010 | Kulkarni et al. |
| 8,664,594 B1 | 4/2014 | Jiang et al. |
| 8,692,204 B2 | 4/2014 | Kojima et al. |
| 8,698,093 B1 | 4/2014 | Gubbens et al. |

(Continued)

OTHER PUBLICATIONS

International Search Report and Written Opinion for PCT/US2020/054647 dated Jan. 20, 2021.
U.S. Appl. No. 16/406,374 by Brauer et al. filed May 8, 2019 (submitted as U.S. Patent Application Publication No. 2020/0193588 published Jun. 18, 2020).

*Primary Examiner* — Mark R Gaworecki
(74) *Attorney, Agent, or Firm* — Ann Marie Mewherter

(57) ABSTRACT

Methods and systems for selecting mode(s) for inspection of specimens are provided. One method includes statistically predicting if data points in a set correspond to defects or nuisances on a specimen. The data points include attribute(s) determined for discrete locations on the specimen from output generated by two or more modes of an inspection system. Events have been detected at the discrete locations with at least one of the modes. The method also includes determining a quantitative measure for each of two or more different combinations of the modes thereby determining different quantitative measures. The quantitative measure for each of the different combinations is responsive to how well one of the combinations detects the defects and minimizes detection of the nuisances. The method further includes selecting one or more of the modes for inspection of specimens of the same type as the specimen based on the determined quantitative measures.

20 Claims, 6 Drawing Sheets

(51) Int. Cl.
    *G03F 7/20*    (2006.01)
    *H01L 21/66*   (2006.01)

(56) References Cited

U.S. PATENT DOCUMENTS

| | | |
|---|---|---|
| 8,716,662 B1 | 5/2014 | MacDonald et al. |
| 10,115,040 B2 | 10/2018 | Brauer |
| 2009/0091749 A1 | 4/2009 | Furman et al. |
| 2011/0320149 A1 | 12/2011 | Lee et al. |
| 2013/0077092 A1 | 3/2013 | Sasazawa et al. |
| 2018/0330511 A1 | 11/2018 | Ha et al. |
| 2019/0277776 A1 | 9/2019 | Gawhane |
| 2019/0302031 A1 | 10/2019 | Plihal et al. |

STATISTICAL LEARNING-BASED MODE SELECTION FOR MULTI-MODE INSPECTION

BACKGROUND OF THE INVENTION

Field of the Invention

The present invention generally relates to methods and systems for statistical learning-based mode selection for multi-mode inspection of specimens in the semiconductor arts.

Description of the Related Art

The following description and examples are not admitted to be prior art by virtue of their inclusion in this section.

Inspection processes are used at various steps during a semiconductor manufacturing process to detect defects on wafers to promote higher yield in the manufacturing process and thus higher profits. Inspection has always been an important part of fabricating semiconductor devices. However, as the dimensions of semiconductor devices decrease, inspection becomes even more important to the successful manufacture of acceptable semiconductor devices because smaller defects can cause the devices to fail.

Many inspection tools have adjustable parameters for many of the output (e.g., image) generation elements of the tools. The parameters for one or more elements (such as energy source(s), polarizer(s), lens(es), detector(s), and the like) may be altered depending on the type of specimen being inspected and the characteristics of the defects of interest (DOIs) on the specimen. For example, different types of specimens may have dramatically different characteristics, which can cause the same tool with the same parameters to image the specimens in extremely different ways. In addition, since different types of DOIs can have dramatically different characteristics, inspection system parameters that are suitable for detection of one type of DOI may not be suitable for detection of another type of DOI. Furthermore, different types of specimens can have different noise sources, which can interfere with detection of DOIs on the specimens in different ways.

The development of inspection tools with adjustable parameters has also led to the increasing use of inspection processes that involve scanning the specimen with more than one combination of parameter values (otherwise referred to as "modes") such that different defect types can be detected with different modes. For example, one mode may have a greater sensitivity for detecting one type of defect while another mode may have a greater sensitivity for detecting another type of defect. Therefore, using both modes, an inspection system may be able to detect both types of defects with acceptable sensitivity.

Several currently used methods are available for optical mode selection (OMS) to find the best mode for inspection. Mode selection can be relatively straightforward when an inspection process uses only one mode of the inspection tool. For example, a performance metric such as DOI capture vs. nuisance suppression can be compared for each mode to identify the mode that has the best performance. This process, however, becomes exponentially more complicated and difficult when more than one mode is used for inspection. For example, one could simply compare the performance metrics of different modes and then select the top two or more for inspection, but that would not necessarily result in an inspection process that is better than if only the top mode was used.

Instead, the impetus for using more than one mode for an inspection is generally that the inspection is relatively difficult to begin with, e.g., the DOIs are relatively difficult to separate from noise and/or the nuisances are relatively difficult to suppress. For such inspections, ideally, two or more modes would be complementary in some manner, e.g., such that the results produced by one mode could enhance the results produced by another mode. In one such example, even if the results produced by one mode are not in of themselves particularly "good," in the right circumstances, those results could be used to separate DOIs and nuisances in other results produced by another mode thereby enhancing the results produced by the other mode.

Oftentimes, such complementary modes are difficult to identify for a number of reasons. One such reason can be that the number of variable settings on an inspection tool is substantially large resulting in a substantial number of modes and an even greater number of mode combinations that can be evaluated. Some inspection mode selection processes aim to streamline this process by eliminating some modes or mode combinations before evaluation is even begun. Even still, the number of modes and mode combinations may be so large as to prohibit all of them from being evaluated. For example, it is not even the scanning of a test specimen with each mode that can be prohibitive, but the evaluation of the data for each mode and mode combination may be so time consuming and expensive that it is prohibitive to perform such mode evaluation for every specimen and every inspection process. In addition, the evaluation of modes and mode combinations is impossible to perform by hand. For example, the amount of data that is generated in the mode selection process is simply too great to be evaluated manually in a timely manner.

Accordingly, it would be advantageous to develop systems and methods for selecting one or more modes for inspection of specimens that do not have one or more of the disadvantages described above.

SUMMARY OF THE INVENTION

The following description of various embodiments is not to be construed in any way as limiting the subject matter of the appended claims.

One embodiment relates to a system configured for selecting one or more modes for inspection of specimens. The system includes one or more computer systems configured for statistically predicting if data points in a set correspond to defects or nuisances on a specimen. The data points include one or more attributes determined for discrete locations on the specimen from output generated by two or more modes of an inspection system. Events have been detected at the discrete locations with at least one of the two or more modes. The one or more computer systems are also configured for determining a quantitative measure for each of two or more different combinations of the two or more modes thereby determining different quantitative measures. The quantitative measure for each of the two or more different combinations is responsive to how well one of the two or more different combinations detects the defects and minimizes detection of the nuisances. In addition, the one or more computer systems are configured for selecting one or more of the two or more modes of the inspection system for inspection of specimens of the same type as the specimen based on the determined quantitative measures. The system may be further configured as described herein.

Another embodiment relates to a method for selecting one or more modes for inspection of specimens. The method includes the statistically predicting, determining, and selecting steps described above, which are performed by one or more computer systems. Each of the steps of the method described above may be further performed as described further herein. In addition, the embodiment of the method described above may include any other step(s) of any other method(s) described herein. Furthermore, the method described above may be performed by any of the systems described herein.

Another embodiment relates to a non-transitory computer-readable medium storing program instructions executable on a computer system for performing a computer-implemented method for selecting one or more modes for inspection of specimens. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Further advantages of the present invention will become apparent to those skilled in the art with the benefit of the following detailed description of the preferred embodiments and upon reference to the accompanying drawings in which.

Figure 1:
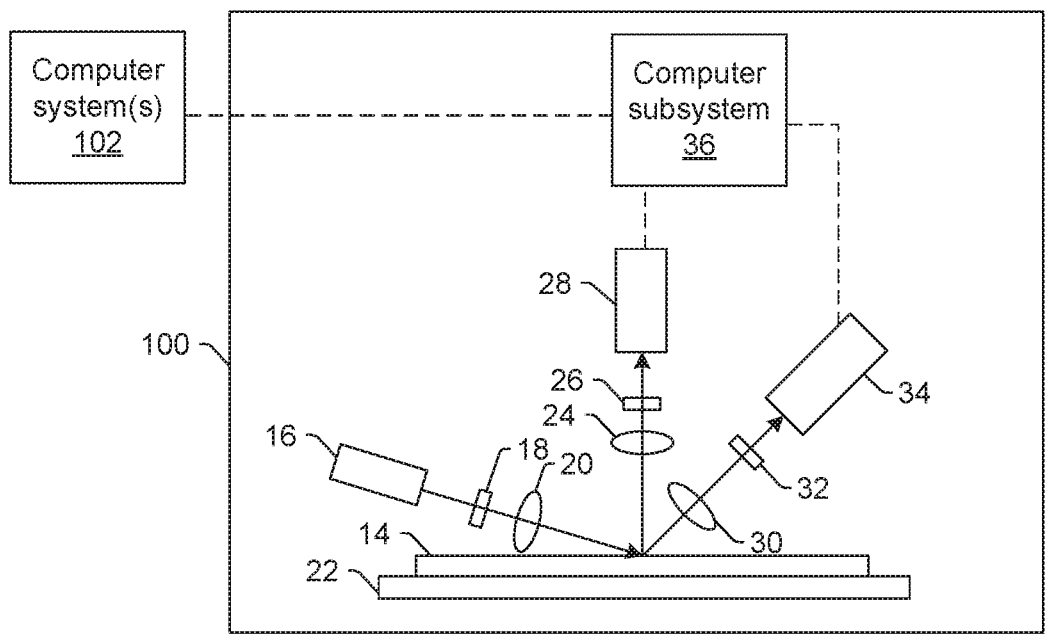
FIGS. 1 and 1a are schematic diagrams illustrating side views of embodiments of a system configured as described herein.

While the invention is susceptible to various modifications and alternative forms, specific embodiments thereof are shown by way of example in the drawings and are herein described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

"Nuisances" (which is sometimes used interchangeably with "nuisance defects") as that term is used herein is generally defined as defects that a user does not care about and/or events that are detected on a specimen but are not really actual defects on the specimen. Nuisances that are not actually defects may be detected as events due to non-defect noise sources on a specimen (e.g., grain in metal lines on the specimen, signals from underlaying layers or materials on the specimen, line edge roughness (LER), relatively small critical dimension (CD) variation in patterned attributes, thickness variations, etc.) and/or due to marginalities in the inspection system itself or its configuration used for inspection.

The term "defects of interest (DOIs)" as used herein is defined as defects that are detected on a specimen and are really actual detects on the specimen. Therefore, the DOIs are of interest to a user because users generally care about how many and what kind of actual defects are on specimens being inspected. In some contexts, the term "DOI" is used to refer to a subset of all of the actual defects on the specimen, which includes only the actual defects that a user cares about. For example, there may be multiple types of DOIs on any given specimen, and one or more of them may be of greater interest to a user than one or more other types. In the context of the embodiments described herein, however, the term "DOIs" is used to refer to any and all real detects on a specimen.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

In general, the embodiments described herein are configured for statistical learning-based mode selection for multi-mode inspections. For example, the systems and methods described herein use one of the statistical learning based methods described herein to select the best mode combination for nuisance reduction in multimode inspections (i.e., to minimize the nuisances that are detected in multimode inspections, which is also commonly referred to as nuisance suppression).

In some embodiments, the specimen is a wafer. The wafer may include any wafer known in the semiconductor arts. Although some embodiments may be described herein with respect to a wafer or wafers, the embodiments are not limited in the specimens for which they can be used. For example, the embodiments described herein may be used for specimens such as reticles, flat panels, personal computer (PC) boards, and other semiconductor specimens.

One embodiment relates to a system configured to select one or more modes for inspection of specimens. One embodiment of such a system is shown in FIG. 1. The system includes one or more computer systems 102. In some embodiments, the system includes an inspection system coupled to the one or more computer systems. For example, in FIG. 1, the system includes inspection system 100 coupled to computer system(s) 102. In the embodiments shown in FIG. 1, the inspection system is configured as a light-based inspection system. However, in other embodiments described herein, the inspection system is configured as an electron beam or charged particle beam inspection system.

In general, the inspection systems described herein include at least an energy source, a detector, and a scanning subsystem. The energy source is configured to generate energy that is directed to a specimen by the inspection system. The detector is configured to detect energy from the specimen and to generate output responsive to the detected energy. The scanning subsystem is configured to change a position on the specimen to which the energy is directed and from which the energy is detected.

In a light-based inspection system, the energy directed to the specimen includes light, and the energy detected from the specimen includes light. For example, in the embodiment of the system shown in FIG. 1, the inspection system includes an illumination subsystem configured to direct light to specimen 14. The illumination subsystem includes at least one light source. For example, as shown in FIG. 1, the illumination subsystem includes light source 16. In one embodiment, the illumination subsystem is configured to direct the light to the specimen at one or more angles of incidence, which may include one or more oblique angles and/or one or more normal angles. For example, as shown in FIG. 1, light from light source 16 is directed through optical element 18 and then lens 20 to specimen 14 at an oblique angle of incidence. The oblique angle of incidence may include any suitable oblique angle of incidence, which may vary depending on, for instance, characteristics of the specimen and the defects to be detected on the specimen.

The illumination subsystem may be configured to direct the light to the specimen at different angles of incidence at different times. For example, the inspection system may be configured to alter one or more characteristics of one or more elements of the illumination subsystem such that the light can be directed to the specimen at an angle of incidence that is different than that shown in FIG. 1. In one such example, the inspection system may be configured to move light source 16, optical element 18, and lens 20 such that the light is directed to the specimen at a different oblique angle of incidence or a normal (or near normal) angle of incidence.

In some instances, the inspection system may be configured to direct light to the specimen at more than one angle of incidence at the same time. For example, the illumination subsystem may include more than one illumination channel, one of the illumination channels may include light source 16, optical element 18, and lens 20 as shown in FIG. 1 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen at different angles of incidence may be different such that light resulting from illumination of the specimen at the different angles of incidence can be discriminated from each other at the detector(s).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the specimen. Multiple illumination channels may be configured to direct light to the specimen at the same time or at different times (e.g., when different illumination channels are used to sequentially illuminate the specimen). In another instance, the same illumination channel may be configured to direct light to the specimen with different characteristics at different times. For example in some instances, optical element 18 may be configured as a spectral filter and the properties of the spectral filter can be changed in a variety of different ways (e.g., by swapping out one to spectral filter with another) such that different wavelengths of light can be directed to the specimen at different times. The illumination subsystem may have any other suitable configuration known in the art for directing the light having different or the same characteristics to the specimen at different or the same angles of incidence sequentially or simultaneously.

Light source 16 may include a broadband plasma (BBP) light source. In this manner, the light generated by the light source and directed to the specimen may include broadband light. However, the light source may include any other suitable light source such as a laser. The laser may include any suitable laser known in the art and may be configured to generate light at any suitable wavelength(s) known in the art. In addition, the laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused onto specimen 14 by lens 20. Although lens 20 is shown in FIG. 1 as a single refractive optical element, in practice, lens 20 may include a number of refractive and/or reflective optical elements that in combination focus the light from the optical element to the specimen. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the system may be configured to alter one or more of the elements of the illumination subsystem based on the type of illumination to be used for inspection.

The inspection system also includes a scanning subsystem configured to change the position on the specimen to which the light is directed and from which the light is detected and possibly to cause the light to be scanned over the specimen. For example, the inspection system may include stage 22 on which specimen 14 is disposed during inspection. The scanning subsystem may include any suitable mechanical and/or robotic assembly (that includes stage 22) that can be configured to move the specimen such that the light can be directed to and detected from different positions on the specimen. In addition, or alternatively, the inspection system may be configured such that one or more optical elements of the inspection system perform some scanning of the light over the specimen such that the light can be directed to and detected from different positions on the specimen. In instances in which the light is scanned over the specimen, the light may be scanned over the specimen in any suitable fashion such as in a serpentine-like path or in a spiral path.

The inspection system further includes one or more detection channels. At least one of the detection channel(s) includes a detector configured to detect light from the specimen due to illumination of the specimen by the system and to generate output responsive to the detected light. For example, the inspection system shown in FIG. 1 includes two detection channels, one formed by collector 24, element 26, and detector 28 and another formed by collector 30, element 32, and detector 34. As shown in FIG. 1, the two detection channels are configured to collect and detect light at different angles of collection. In some instances, both detection channels are configured to detect scattered light, and the detection channels are configured to detect light that is scattered at different angles from the specimen. However, one or more of the detection channels may be configured to detect another type of light from the specimen (e.g., reflected light).

As further shown in FIG. 1, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 30, element 32, and detector 34 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 1 shows an embodiment of the inspection system that includes two detection channels, the inspection system may include a different number of detection channels (e.g., only one detection channel or two or more detection channels). In one such instance, the detection channel formed by collector 30, element 32, and detector 34 may form one side channel as described above, and the inspection system may include an additional detection channel (not shown) formed as another side channel that is positioned on the opposite side of the plane of incidence. Therefore, the inspection system may include the detection channel that includes collector 24, element 26, and detector 28 and that is centered in the plane of incidence and configured to collect and detect light at scattering angle(s) that are at or close to normal to the specimen surface. This detection channel may therefore be commonly referred to as a "top" channel, and the inspection system may also include two or more side channels configured as described above. As such, the inspection system may include at least three channels (i.e., one top channel and two side channels), and each of the at least three channels has its own collector, each of which is configured to collect light at different scattering angles than each of the other collectors.

As described further above, each of the detection channels included in the inspection system may be configured to detect scattered light. Therefore, the inspection system shown in FIG. 1 may be configured for dark field (DF) inspection of specimens. However, the inspection system may also or alternatively include detection channel(s) that are configured for bright field (BF) inspection of specimens. In other words, the inspection system may include at least one detection channel that is configured to detect light specularly reflected from the specimen. Therefore, the inspection systems described herein may be configured for only DF, only BF, or both DF and BF inspection. Although each of the collectors are shown in FIG. 1 as single refractive optical elements, it is to be understood that each of the collectors may include one or more refractive optical element(s) and/or one or more reflective optical element(s).

The one or more detection channels may include any suitable detectors known in the art. For example, the detectors may include photo-multiplier tubes (PMTs), charge coupled devices (CCDs), and time delay integration (TDI) cameras. The detectors may also include non-imaging detectors or imaging detectors. If the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the inspection system may be signals or data, but not image signals or image data. In such instances, a computer subsystem such as computer subsystem 36 of the inspection system may be configured to generate images of the specimen from the non-imaging output of the detectors. However, in other instances, the detectors may be configured as imaging detectors that are configured to generate imaging signals or image data. Therefore, the inspection system may be configured to generate images in a number of ways.

It is noted that FIG. 1 is provided herein to generally illustrate a configuration of an inspection system that may be included in the system embodiments described herein. Obviously, the inspection system configuration described herein may be altered to optimize the performance of the inspection system as is normally performed when designing a commercial inspection system. In addition, the systems described herein may be implemented using an existing inspection system (e.g., by adding functionality described herein to an existing inspection system) such as the 29xx/39xx series of tools that are commercially available from KLA, Milpitas, Calif. For some such systems, the methods described herein may be provided as optional functionality of the inspection system (e.g., in addition to other functionality of the inspection system). Alternatively, the inspection system described herein may be designed "from scratch" to provide a completely new inspection system.

Computer subsystem 36 may be coupled to the detectors of the inspection system in any suitable manner (e.g., via one or more transmission media, which may include "wired" and/or "wireless" transmission media) such that the computer subsystem can receive the output generated by the detectors. Computer subsystem 36 may be configured to perform a number of functions using the output of the detectors. For instance, the computer subsystem may be configured to detect events on the specimen using the output of the detectors. Detecting the events on the specimen may be performed by applying some defect detection algorithm and/or method to the output generated by the detectors. The defect detection algorithm and/or method may include any suitable algorithm and/or method known in the art. For example, the computer subsystem may compare the output of the detectors to a threshold. Any output having values above the threshold may be identified as an event (e.g., a potential defect) while any output having values below the threshold may not be identified as an event.

The computer subsystem of the inspection system may be further configured as described herein. For example, computer subsystem 36 may be part of the one or more computer systems described herein or may be configured as the one or more computer systems described herein. In particular, computer subsystem 36 may be configured to perform the statistically predicting, determining, and selecting steps described herein. As such, the steps described herein may be performed "on-tool," by a computer system or subsystem that is part of an inspection system.

The computer subsystem of the inspection system (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, then the different computer subsystems may be coupled to each other such that images, data, information, instructions, etc. can be sent between the computer subsystems. For example, computer subsystem 36 may be coupled to computer system(s) 102 as shown by the dashed line in FIG. 1 by any suitable transmission media, which may include any suitable wired and/or wireless transmission media known in the art. Two or more of such computer subsystems may also be effectively coupled by a shared computer-readable storage medium (not shown).

Although the inspection system is described above as being an optical or light-inspection system, in another embodiment, the inspection system is configured as an electron beam inspection system. In an electron beam inspection system, the energy directed to the specimen includes electrons, and the energy detected from the specimen includes electrons. In one such embodiment shown in FIG. 1a, the inspection system includes electron column 122, and the system includes computer subsystem 124 coupled to the inspection system. Computer subsystem 124 may be configured as described above. In addition, such an inspection system may be coupled to another one or more computer systems in the same manner described above and shown in FIG. 1.

Figure 1A:
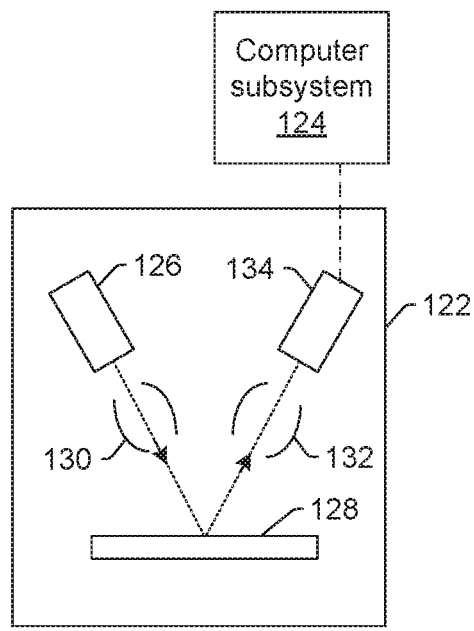

As also shown in FIG. 1a, the electron column includes electron beam source 126 configured to generate electrons that are focused to specimen 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the specimen (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 1a as being configured such that the electrons are directed to the specimen at an oblique angle of incidence and are scattered from the specimen at another oblique angle, the electron beam may be directed to and scattered from the specimen at any suitable angles. In addition, the electron beam inspection system may be configured to use multiple modes to generate output for the specimen as described further herein (e.g., with different illumination angles, collection angles, etc.). The multiple modes of the electron beam inspection system may be different in any output generation parameters of the inspection system.

Computer subsystem 124 may be coupled to detector 134 as described above. The detector may detect electrons returned from the surface of the specimen thereby forming electron beam images of (or other output for) the specimen. The electron beam images may include any suitable electron beam images. Computer subsystem 124 may be configured to detect events on the specimen using output generated by detector 134, which may be performed as described above or in any other suitable manner. Computer subsystem 124 may be configured to perform any additional step(s) described herein. A system that includes the inspection system shown in FIG. 1a may be further configured as described herein.

It is noted that FIG. 1a is provided herein to generally illustrate a configuration of an electron beam inspection system that may be included in the embodiments described herein. As with the optical inspection system described above, the electron beam inspection system configuration described herein may be altered to optimize the performance of the inspection system as is normally performed when designing a commercial inspection system. In addition, the systems described herein may be implemented using an existing inspection system (e.g., by adding functionality described herein to an existing inspection system) such as the tools that are commercially available from KLA. For some such systems, the methods described herein may be provided as optional functionality of the system (e.g., in addition to other functionality of the system). Alternatively, the system described herein may be designed "from scratch" to provide a completely new system.

Although the inspection system is described above as being a light or electron beam inspection system, the inspection system may be an ion beam inspection system. Such an inspection system may be configured as shown in FIG. 1a except that the electron beam source may be replaced with any suitable ion beam source known in the art. In addition, the inspection system may include any other suitable ion beam imaging system such as those included in commercially available focused ion beam (FIB) systems, helium ion microscopy (HIM) systems, and secondary ion mass spectroscopy (SIMS) systems.

As further noted above, the inspection system is configured to have multiple modes. In general, a "mode" can be defined by the values of parameters of the inspection system used to generate output for the specimen. Therefore, modes that are different may be different in the values for at least one of the optical or electron beam parameters of the inspection system (other than position on the specimen at which the output is generated). For example, for a light-based inspection system, different modes may use different wavelengths of light. The modes may be different in the wavelengths of light directed to the specimen as described further herein (e.g., by using different light sources, different spectral filters, etc.) for different modes. In another embodiment, different modes may use different illumination channels. For example, as noted above, the inspection system may include more than one illumination channel. As such, different illumination channels may be used for different modes.

The multiple modes may also be different in illumination and/or collection/detection. For example, as described further above, the inspection system may include multiple detectors. Therefore, one of the detectors may be used for one mode and another of the detectors may be used for another mode. Furthermore, the modes may be different from each other in more than one way described herein (e.g., different modes may have one or more different illumination parameters and one or more different detection parameters). The inspection system may be configured to scan the specimen with the different modes in the same scan or different scans, e.g., depending on the capability of using multiple modes to scan the specimen at the same time.

If different modes are used to generate output for the specimen in different scans, the output generated in the different scans may be aligned in some manner. For example, if images are generated in the different scans, the images may be aligned to each other so that images generated at the same location on the specimen can be used collectively for inspection. In other instances, the output generated for the same location in different scans may be aligned to each other so that results of any defect detection performed using the output generated in different scans may be aligned to each other. For example, if the output is generated in different scans with different modes, the output may be aligned to each other so that the results of defect detection (e.g., defect candidates) detected with different modes are aligned to each other. In this manner, the results of the alignment can be easily used to determine which results have spatial coincidence with each other on the specimen across different modes.

The alignment described above can be performed in a number of different ways. In some instances, the alignment can be performed in an image-to-image alignment using some pattern matching or other suitable technique. The alignment may also be performed in an align to design manner, some examples of which are described in U.S. Pat. No. 7,676,077 to Kulkarni issued Mar. 9, 2010, which is incorporated by reference as if fully set forth herein. The alignment may also be performed using a deep learning technique such as those described in U.S. Patent Application Publication 2018/0330511 by Ha et al. published Nov. 15, 2018, which is incorporated by reference as if fully set forth herein. The embodiments described herein may be further configured as described in these references.

The system includes one or more computer systems, which may include any configuration of any of the computer subsystem(s) or system(s) described above. The one or more computer systems are configured for statistically predicting if data points in a set correspond to defects or nuisances on a specimen, as shown in step 300 of FIG. 3. The data points include one or more attributes determined for discrete locations on the specimen from output generated by two or more modes of an inspection system. Events have been detected at the discrete locations with at least one of the two or more modes. In other words, the discrete locations do not include locations on the specimen at which an event has not been detected with at least one of the two or more of the modes. In still other words, the discrete locations include only locations on the specimen at which an event has been detected using at least one of the two or more modes. For example, although an inspection system may scan the specimen in swaths or paths across the specimen that include at least partially overlapping illuminated spots, thereby generating output at every location scanned on the specimen, events will not be detected at every location. Therefore, for any discrete location at which an event is detected, the one or more attributes may be determined for that location from the output generated at that location (e.g., attributes a and/or b for discrete location x, attributes a and/or b for discrete location y, and so on). As such, the attribute(s) will be determined for fewer than all of the locations that are scanned and without using all of the output that is generated by the inspection system during the scanning. In addition, although the attributes are determined at discrete locations, the inspection system does not generate output at only the discrete locations as a move-acquire-measure instrument would. The statistically determining step may be performed as described further herein.

Figure 3:
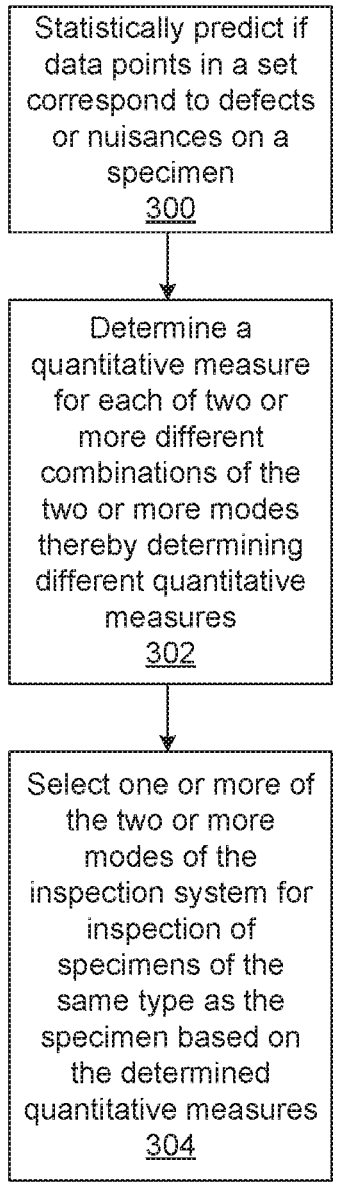
FIGS. 3-6 are flow charts illustrating embodiments of steps that may be performed for selecting one or more modes for inspection of specimens.

The computer system(s) are also configured for determining a quantitative measure for each of two or more different combinations of the two or more modes thereby determining different quantitative measures, as shown in step 302 of FIG. 3. The quantitative measure for each of the two or more different combinations is responsive to how well one of the two or more different combinations detects the defects and minimizes detection of the nuisances. The two or more different combinations of the two or more modes may be identified and/or selected in a variety of different manners. For example, the two or more different mode combinations may include all of the available mode combinations on the inspection system. Evaluating such a number of mode combinations may however be undesirable even for the embodiments described herein due to time and cost involved in such evaluations. Therefore, the two or more different combinations may include fewer than all of the available mode combinations on the inspection system. Such a subset of mode combinations may be selected by a user or in some other manner (e.g., based on mode combinations that were at least nominally successful for inspection of specimens similar to the specimens for which the modes are being selected). The mode combinations that are evaluated in the embodiments described herein may therefore be selected manually by a user or automatically by the embodiments described herein. The determining step described above may be performed as described further herein.

The computer system(s) are further configured for selecting one or more of the two or more modes of the inspection system for inspection of specimens as the same type as the specimen based on the determined quantitative measures, as shown in step 304 of FIG. 3. The specimen and the specimens of the same type may include different specimens that have been processed using the same fabrication step(s). For example, the specimen used to select the one or more of the modes for inspection may be a wafer of the same layer as the wafers for which the modes are being selected. The one or more modes that are selected may include at least two modes, e.g., two modes, three modes, etc. However, although the embodiments described herein are particularly suitable for selecting a combination of modes for use in an inspection process, the embodiments described herein can also be used for single mode inspection setup. The selecting step may be performed as described further herein.

Two ways are described further herein for performing the above-described steps for mode selection for multimode inspections. The first one is unsupervised, and the second one is supervised. Experiments performed by the inventors have shown that they mostly agree in terms of results.

The steps described above may be performed using an anomaly detection-based approach to find the best mode combination. For example, there are multiple attributes associated with each defect candidate (including defect candidates that are determined to be DOI or nuisance). Each attribute "measures" different aspects of a defect candidate (e.g., signal-to-noise ratio). The multimode selection problem therefore becomes essentially a combinatorial search problem, where the objective is to search through the mode and attribute space for a combination where the separation between DOI and nuisance is maximum. In other words, since inspection processes separate defect candidates into DOIs and nuisances based on any attribute(s) (or some subset of attributes) determined for the defect candidates, identifying modes that produce attribute(s) that are sufficiently different (or separated in attribute space) for DOIs and nuisances and can therefore be used to separate DOIs and nuisances (whether it is done by a defect detection algorithm, a nuisance filter, or a defect classifier) is crucial to creating a successful inspection process.

Since the dataset produced in such a manner is heavily imbalanced in favor of the nuisances (e.g., simply due to the significantly greater numbers of nuisances that will be detected on any given specimen for which the embodiments described herein would be used compared to the number of DOIs that would be present on such a specimen), this method is based on outlier detection, an unsupervised method. Hence, in one such embodiment, the statistically predicting, determining the quantitative measure, and selecting the one or more modes steps are unsupervised. A benefit of the unsupervised method over a supervised method is that there are many examples available of what a typical nuisance looks like, whereas the number of DOIs are substantially few (e.g., about 5 to 10 per specimen).

Figure 4:
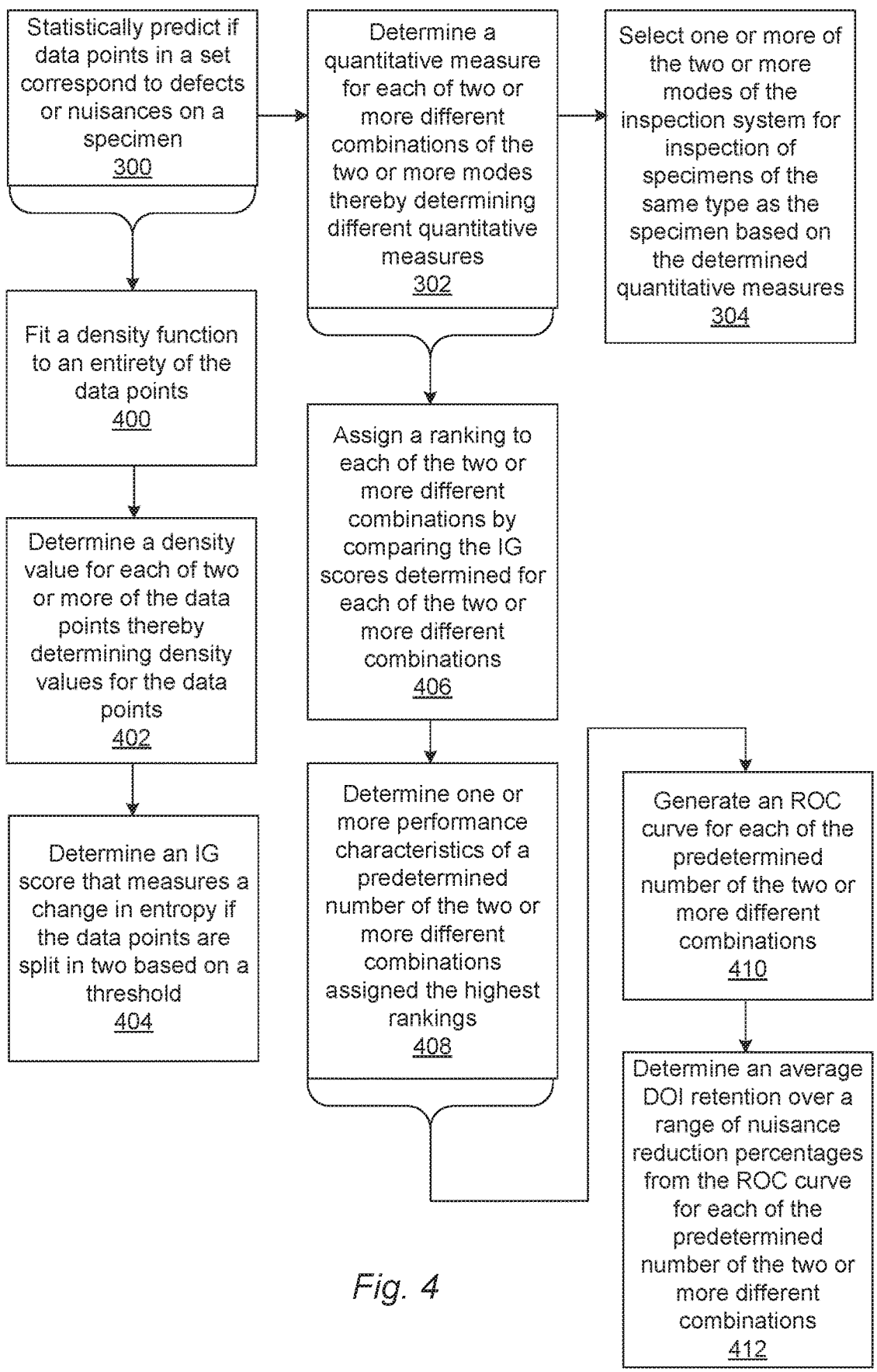

In one embodiment, the statistically predicting, as shown in step 300 of FIG. 4, includes fitting a density function to an entirety of the data points, as shown in step 400 of FIG. 4, determining a density value for each of two or more of the data points thereby determining density values for the data points, as shown in step 402 of FIG. 4, the density values estimate a chance that the data points correspond to the nuisances, and determining an information gain score that measures a change in entropy if the data points are split in two based on a threshold, as shown in step 404 of FIG. 4. For example, it can be assumed that most of the pixels of inspection system output generated for a specimen such as a wafer are nuisance, and DOIs are outliers in the nuisance distribution. Thus, for each mode combination ijk and attributes m,n,q for the corresponding modes, e.g., attribute m for mode i, attribute n for mode j, attribute q for mode k, etc., the computer system(s) may fit a density function (e.g., a Gaussian) to the entire dataset assuming every datapoint (whether later-determined to be a DOI or nuisance) is a nuisance. In this manner, the density function per mode combination (e.g., a mode triplet) may be determined based on a number of attributes equal to the modes in the combination (e.g., 3 attributes for a mode triplet).

The attributes may include any suitable defect attributes that can be determined by the computer system(s) or inspection system based on the output generated by the inspection system, and the computer system(s) or inspection system may determine the defect attributes in any suitable manner known in the art. Therefore, the attributes that are determined for any one defect on any one specimen may vary depending on the configuration of the inspection system as well as the attributes that are of interest to a user (e.g., not all of the attributes that can be determined using the output may be useful in the inspection process and/or to a user). An attribute may be determined for each data point (each detected event, defect candidate etc.) and each given mode.

Then, a density value is calculated for each datapoint, and this density estimates the chance that the datapoint is a nuisance. For example, imagine a substantially big dataset of defect candidates for a given mode and attribute combination. For all of these defect candidates, a histogram in the attribute space can be created. If the histogram is normalized so that all the bars add up to 1, each bar represents a density (also called probability or probability density) because it tells you how likely it is that you observe this particular attribute value combination.

Following that, the computer system(s) calculate an information gain (IG) score, which measures the change in entropy if the defect candidate set is split into two based on a threshold T. The IG score is determined separately for each mode/attribute combination. For example, when setting a threshold that separates DOIs and nuisances, the entropy in the set will likely be reduced (as it is less likely that DOIs and nuisances are confused). This entropy is then compared to the entropy of the original distribution. If the difference in entropy is relatively large, the DOIs and nuisances have been separated relatively well using the threshold. This is what is called information gain. The higher this gain, the better the separation.

Using an IG score for the embodiments described herein is particularly advantageous because the goal of the inspections for which the mode combinations are being selected is to successfully separate data into two different categories (at least), namely DOIs and nuisances. Therefore, the IG score determined as described herein serves as a relatively good estimation of how well the different combinations will perform. Mode combinations that have higher IG scores show an ability to separate DOIs and nuisances in a dataset relatively well, while mode combinations that have lower IG scores will most likely be unable to sufficiently separate DOIs from nuisances in the datasets that they generate.

In one such embodiment of the unsupervised method, for the $i^{th}$, $j^{th}$, $k^{th}$ mode combinations, create a dataset $D_{ijk}^{mnq}=[d_i^m, d_j^n, d_k^q]$, where $d_i^m$ is the column vector representing the $m^{th}$ attribute for the $i^{th}$ mode. Each column vector contains defect candidate information and thus both DOI and nuisance information. For each $D_{ijk}^{mnq}$, find a function F (using a density estimation algorithm), which estimates the probability density for each defect candidate, both DOIs and nuisances: $P_{ijk}^{mnq}=F(D_{ijk}^{mnq})$. Using $P_{ijk}^{mnq}$, calculate the information gain, when DOI and nuisance are divided into two classes based on a threshold $T^{mnq}$. $IG(D_{ijk}^{mnq}, T^{mnq})=H(D_{ijk}^{mnq})-H(D_{ijk}^{mnq}|T^{mnq})$, where H is the entropy ($\Sigma_i$-$p_i$ $\log_2$ $p_i$). Then find T, which maximizes IG.

In another such embodiment, determining the quantitative measure, as shown in step 302 of FIG. 4, includes assigning a ranking to each of the two or more different combinations by comparing the information gain scores determined for each of the two or more different combinations, as shown in step 406 of FIG. 4, and the rankings are assigned such that higher rankings correspond to higher information gain scores. For example, if the defect candidate set perfectly splits into DOI and nuisance (complete separation), then the IG is maximal. In addition, as described further above, a higher IG score will indicate a better ability to separate DOIs and nuisances while lower IG scores will indicate a lesser ability to separate DOIs and nuisances. The mode and attribute combinations are then ranked by the IG score. The resulting rankings therefore provide a measure of how well different modes perform relative to other modes being evaluated. In this step, within a mode combination ijk, the computer system(s) may sort attribute combinations from highest information gain to lowest. This sorted list may be called $M_{ijk}^{mnq}$.

In some such embodiments, determining the quantitative measure, as shown in step 302 in FIG. 4, also includes determining one or more performance characteristics of a predetermined number of the two or more different combinations assigned the highest rankings, as shown in step 408 in FIG. 4, and the determined quantitative measure upon which the selecting is based includes the determined one or more performance characteristics. For example, one or more performance characteristics may be computed in for the top x (e.g., 10) mode combination candidates. In this manner, after the mode combinations are ranked, some of the mode combinations may be eliminated from further evaluation. While eliminating some of the mode combinations from further evaluation may be advantageous for making the additional steps quicker and less expensive, this is not necessary and all of the mode combinations may be considered further if desired. Determining the one or more performance characteristics and selecting the one or more modes based on such performance characteristics may otherwise be performed as described further herein.

In an additional such embodiment, determining the one or more performance characteristics, as shown in step 408 of FIG. 4, includes generating a receiver operating characteristic curve for each of the predetermined number of the two or more different combinations, as shown in step 410 of FIG. 4, and determining an average defect of interest retention over a range of nuisance reduction percentages from the receiver operating characteristic curve for each of the predetermined number of the two or more different combinations, as shown in step 412 of FIG. 4, and the determined one or more performance characteristics upon which the selecting shown in step 304 of FIG. 4 is based include the determined average defect of interest retentions. For example, receiver operating characteristic curves (ROC curves) may be computed for the top x (e.g., 10) candidates. The ROC curves may be generated in any suitable manner known in the art. The selecting step may then include selecting the mode combination candidate with the highest average DOI retention (averaged over 5% to 35% nuisance reduction, for example) as the mode combination for multimode inspection. For example, the computer system(s) may choose mode and attribute combination $M_i$, $M_j$, $M_k$, which has the largest area under the ROC curve between, say, 5% to 35% nuisance reduction. In other words, the computer system(s) may calculate the area between 0.05 and 0.35 false positive (or nuisance), where a false positive rate of 1 means that all nuisance examples are within the sample. This area under curve is then compared to all the other mode attribute combinations to thereby determine the best mode combination for inspection.

A random forest decision tree based approach to find the best mode combination will now be described. For example, in another embodiment, the statistically predicting, as shown in step 300 in FIG. 5, includes inputting the data points into a random forest decision tree, as shown in step 500 in FIG. 5, configured for separating the data points into two or more regions and assigning classes to the data points based on the most commonly occurring classes of training samples separated into the two or more regions. In one such embodiment, the statistically predicting, determining the quantitative measure, and selecting the one or more modes are supervised. In another such embodiment, the two or more regions are non-overlapping regions defined by different, non-overlapping ranges of values for the one or more attributes determined for the discrete locations.

In the above described embodiments, a decision tree may be built in two steps. First, the predictor space, defined by all of the attributes that are calculated for a given defect candidate is divided into distinct, non-overlapping regions $R_m$ with m ranging from 1 to n. Second, for every defect candidate that falls into region $R_m$, we predict that each defect candidate belongs to the most commonly occurring class of training observations in the region to which it belongs. The decision tree may be built by the embodiments described herein or by another system or method.

Figure 5:
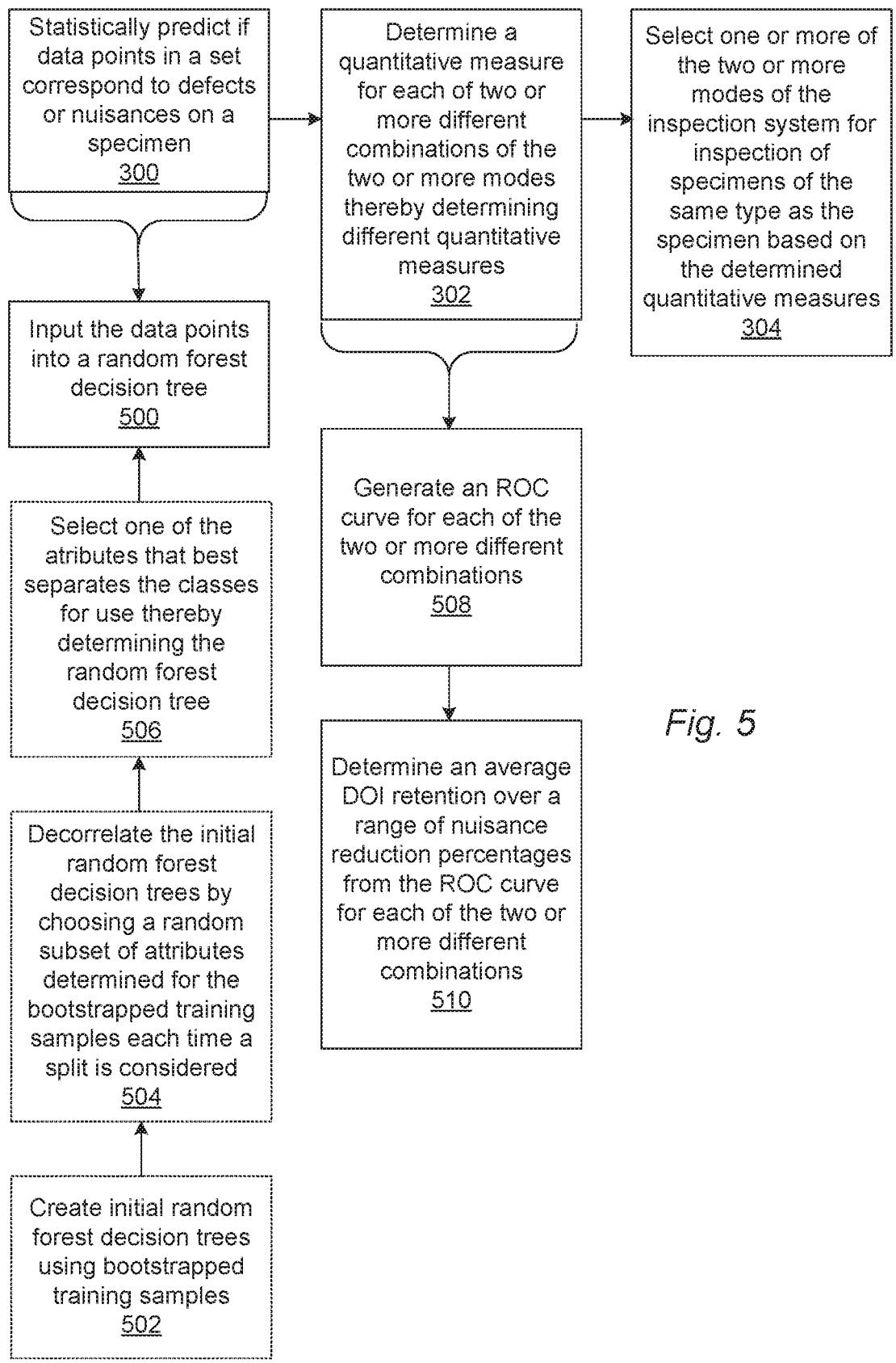

In an additional such embodiment, the one or more computer systems are configured for creating initial random forest decision trees using bootstrapped training samples, as shown in step 502 of FIG. 5, decorrelating the initial random forest decision trees by choosing a random subset of attributes determined for the bootstrapped training samples each time a split is considered, as shown in step 504 of FIG. 5, and selecting one of the attributes in the random subset that best separates the classes for use thereby determining the random forest decision tree, as shown in step 506 of FIG. 5. For example, to reduce the statistical variance (prediction error on the test data), many trees may be created using bootstrapped training samples (aka bagging). In order to decorrelate the trees, the following step is performed: each time a split is considered, a random subset of attributes is chosen (usually square root of total number of attributes) and then the attribute that best separates the classes is used (the concept of a random forest). This random forest model, which is derived on a certain training dataset, can then be applied to a test dataset, e.g., as shown in step 500 of FIG. 5, and the probability of every defect candidate being a DOI can be calculated.

In a further such embodiment, the random forest decision tree is configured to use an ensemble learning based technique. If the size of the test dataset is substantially small, an ensemble learning based technique can be used. One possible way to use such an ensemble learning based technique is to create two or more, e.g., n=5, equivalent datasets. Each one of the datasets may be randomly split into training (e.g., 70% of events) and test sets (remaining events). For each of the combinations of the modes, containing a certain number of attributes each, the resulting, e.g., n=50, DOI capture versus nuisance capture distributions may be added and normalized.

In another such embodiment, determining the quantitative measure, as shown in step 302 of FIG. 5, includes generating a ROC curve for each of the two or more different combinations, as shown in step 508 of FIG. 5, and determining an average DOI retention over a range of nuisance reduction percentages from the ROC curve for each of the two or more different combinations, as shown in step 510 of FIG. 5, and the determined quantitative measures upon which the selecting shown in step 304 in FIG. 5 is based include the determined average DOI retentions. In this manner, the area under the ROC type curve may be used to determine the best mode combination, which may be performed as described further herein.

Figure 6:
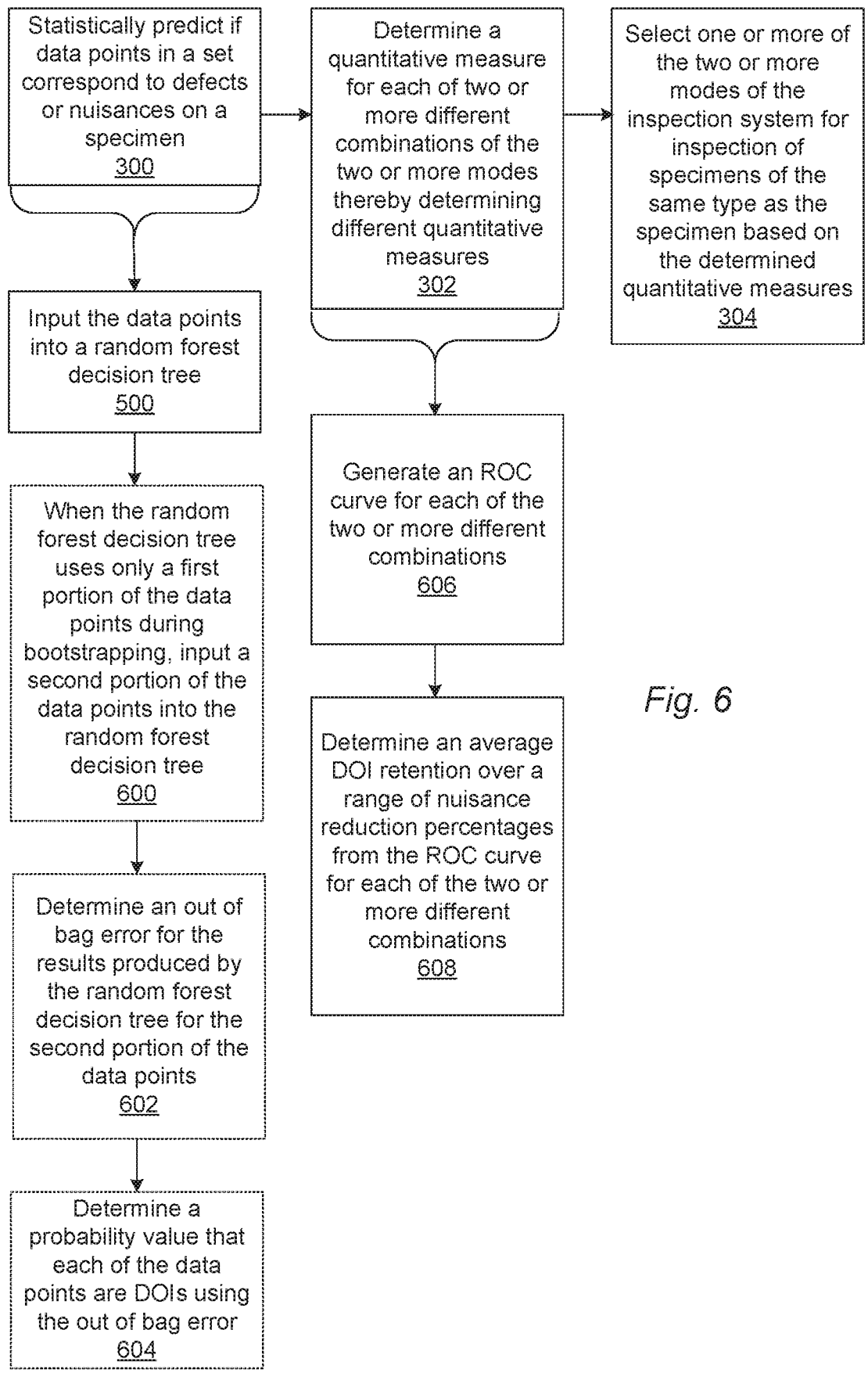

In an additional such embodiment, the random forest decision tree is configured for using only a first portion of the data points during bootstrapping, and the statistically predicting, as shown in step 300 of FIG. 6, also includes inputting a second portion of the data points into the random forest decision tree, as shown in step 600 of FIG. 6, determining an out of bag error for the results produced by the random forest decision tree for the second portion of the data points, as shown in step 602 of FIG. 6, and determining a probability value that each of the data points are DOIs using the out of bag error, as shown in step 604 of FIG. 6. For example, as the number of attributes and the defect candidate count used in a mode selector session become bigger and more modes are investigated, the time involved in the proposed ensemble learning increases and a more efficient way for averaging random forest models can be considered. Note that random forest uses only 1−1/e=63% of the samples during bootstrapping. The remaining 37% are called out of bag (OOB) samples and can be used to calculate the OOB error, which is a relatively good approximation for the test error. Also, in this case, we get a probability value for each event being a DOI and thus we can use the area under the ROC type curve to determine the best mode combination.

In a further such embodiment, determining the quantitative measure, as shown in step 302 in FIG. 6, includes generating an ROC curve for each of the two or more different combinations, as shown in step 606 of FIG. 6, and determining an average retention of the DOIs over a range of nuisance reduction percentages from the ROC curve for each of the two or more different combinations, as shown in step 608 of FIG. 6, and the determined quantitative measures upon which the selecting shown in step 304 of FIG. 6 is based include the determined average DOI retention. In this manner, the area under the ROC type curve may be used to determine the best mode combination, which may be performed as described further herein.

In some embodiments, the computer system(s) are configured for storing information for the selected one or more modes for use in an inspection process performed on the specimens by the inspection system. The computer system(s) may be configured to store the information in a recipe or by generating a recipe for the inspection process in which the selected modes will be used. A "recipe" as that term is used herein can be generally defined as a set of instructions that can be used by a tool to perform a process on a specimen. In this manner, generating a recipe may include generating information for how a process is to be performed, which can then be used to generate the instructions for performing that process. The information for the selected one or more modes that is stored by the computer system(s) may include any information that can be used to identify and/or use the selected mode(s) (e.g., such as a file name and where it is stored, and the file may include information for the modes such as mode names, mode parameter values, etc.).

As noted above, the impetus for using more than one mode for an inspection is generally that the inspection is relatively difficult to begin with, e.g., the DOIs are relatively difficult to separate from noise and/or the nuisances are relatively difficult to suppress. For such inspections, ideally, two or more modes would be complementary in some manner, e.g., such that the results produced by one mode could enhance the results produced by another mode. In one such example, even if the results produced by one mode are not in of themselves particularly "good," in the right circumstances, those results could be used to separate DOIs and nuisances in other results produced by another mode thereby enhancing the results produced by the other mode.

The modes that are selected by the embodiments described herein may be complementary in such a manner. For example, a primary mode may be selected that is used for detection of events, i.e., defect candidates, on the specimen. That primary mode may however result in the defect candidate populations including a significant quantity, proportion, percentage, etc. of nuisances. The inspection system may not be able to separate those nuisances from the defects through processing, e.g., the signals from, images of, and/or attributes determined for defects and nuisances obtained using the primary mode may simply not be separable in any manner. A secondary mode may then be used to filter out the nuisances from the defects. For example, even if the secondary mode is less sensitive than the primary mode (e.g., the secondary mode would not in of itself detect as many defects compared to the primary mode), the output generated by the secondary mode at locations of the defects and nuisances detected by the primary mode may have characteristics that are sufficiently different for defect/nuisance separation purposes. In this manner, the modes may be used in a different manner than two mode detection. In other words, the primary mode may be used for detection, and the secondary mode may be used for separation of the events detected by the primary mode into defects (or DOIs) and nuisances.

In some such instances, when the secondary mode is used only for separation purposes, the inspection system may simply position its field of view on a location-by-location basis at the reported locations of the defect candidates that have been detected in the primary mode to collect new output (e.g., image information, etc.) for them with the secondary mode. In this manner, the inspection system may be configured to perform output generation at only discrete locations on the specimen at which events were detected on the specimen with the primary mode rather than performing a re-scan of the entire area of the specimen scanned with the primary mode. As such, the inspection system may perform output generation in a move-acquire-measure manner with the secondary mode. In such inspection processes then, the primary and secondary modes may be used sequentially, first for a scan of the entire inspected area on the specimen and then for targeted output generation at the locations of the detected events. In addition, the inspection process may not necessarily include generating output with the secondary mode at the location of every event detected with the primary mode. For example, results generated with the secondary mode at the locations of some of the events detected with the primary mode may be used to filter out other events detected with the primary mode. In another example, a preliminary filtering of the events detected with the primary mode may be performed to separate any events that are obviously defects or obviously nuisances, and the secondary mode may then be used to generate output at the remaining events that could not be obviously separated.

The embodiments described herein are however obviously not limited to the inspection process for which mode selection can be performed. In other words, the embodiments described herein can be used for mode selection of any inspection process, including single mode inspection processes. In addition, the inspection process for which the modes may be selected using the embodiments described herein may include inspection processes in which multiple modes perform detection and the collective results are used to perform separation ("multi-mode detection"), in which multiple modes are used to scan an entire area of the specimen either simultaneously or separately, inspection to processes that use more than two modes, etc.

The computer system(s) may be configured for storing the information for the selected mode(s) in any suitable computer-readable storage medium. The information may be stored with any of the results described herein and may be stored in any manner known in the art. The storage medium may include any storage medium described herein or any other suitable storage medium known in the art. After the information has been stored, the information can be accessed in the storage medium and used by any of the method or system embodiments described herein, formatted for display to a user, used by another software module, method, or system, etc. For example, the embodiments described herein may generate an inspection recipe as described above. That inspection recipe may then be stored and used by the system or method (or another system or method) to inspect the specimen or other specimens to thereby generate information (e.g., defect information) for the specimen or other specimens.

The one or more computer systems and/or the inspection system may be configured to use the results of the selecting step to perform the inspection process on the specimens. Such an inspection process may produce results for any defects detected on the specimens such as information, e.g., location, etc., of the bounding boxes of the detected defects, detection scores, information about defect classifications such as class labels or IDs, etc., or any such suitable information known in the art. The results for the defects may be generated by the computer system(s) and/or inspection system in any suitable manner. The results for the defects may have any suitable form or format such as a standard file type. The computer system(s) and/or inspection system may generate the results and store the results such that the results can be used by the computer system(s) and/or another system or method to perform one or more functions for the specimens or another specimen of the same type. Such functions include, but are not limited to, altering a process such as a fabrication process or step that was performed on the specimens in a feedback manner, altering a process such as a fabrication process or step that will be performed on the specimens in a feedforward manner, etc.

The embodiments described herein have a number of advantages over other methods and systems for selecting modes for inspection. For example, the techniques described herein can be used for selecting the best secondary modes for multimode inspections. In addition, only a small number of DOIs are required to identify the best modes for multimode inspections. Furthermore, the embodiments described herein allow discovery of inspection configurations (e.g., mode selection) that can increase the sensitivity of the inspections to certain DOIs. The results of such inspections therefore can enable better decision making regarding process control (e.g., changing one or more parameters of the process used to fabricate the specimens to reduce and even minimize the DOIs on other specimens of the same type).

The advantages of the embodiments described herein are provided by a number of important differences between the embodiments and other methods and systems for selecting modes for inspection. For example, the embodiments described herein may use anomaly detection to find the best modes for multimode inspections. In addition, the embodiments described herein may make use of the nuisance distribution in a multimode, multi-attribute space to create an anomaly detector. Furthermore, the embodiments described herein may use a random forest technique to find the best modes for multimode inspections. Moreover, the embodiments described herein may use the OOB error to find the best modes for multimode inspections.

The embodiments described herein may also be integrated into currently used optics selector products in their main user interface (UI) where the area under the curve (AUC) may be presented to the user to find out which mode combination performs best. In other words, the ROC curves and any performance characteristics determined therefrom (e.g., average DOI retention over a range of nuisance reduction percentages) may be presented to a user, e.g., via any suitable display device and UI, with functionality for receiving from the user a preference for the mode combination to be selected for the inspection. Allowing the user to provide input on which mode combination is to be selected may be advantageous when there may be more than one suitable mode combination, when there does not seem to be any suitable mode combination, and/or when the performance characteristics indicate there may be some need for user input. Such display and UI functionality may be also used to present the selected mode combination and any other results of any other steps described herein to the user for approval or rejection.

The embodiments described herein may also be configured as described in commonly owned U.S. Pat. No. 10,115,040 by Brauer issued Oct. 30, 2018 and U.S. patent application Ser. No. 16/406,374 by Brauer et al. filed May 8, 2019, which are incorporated by reference as if fully set forth herein.

Each of the embodiments of the system described above may be combined together into one single embodiment. In other words, unless otherwise noted herein, none of the system embodiments are mutually exclusive of any other system embodiments.

Another embodiment relates to a method for selecting one or more modes for inspection of specimens. The method includes the statistically predicting, determining a quantitative measure, and selecting one or more of the two or more modes steps described above. The steps are performed by one or more computer systems, which may be configured according to any of the embodiments described herein.

Each of the steps of the method may be performed as described further herein. The method may also include any other step(s) that can be performed by the inspection system and/or computer system(s) described herein. In addition, the method described above may be performed by any of the system embodiments described herein.

Figure 2:
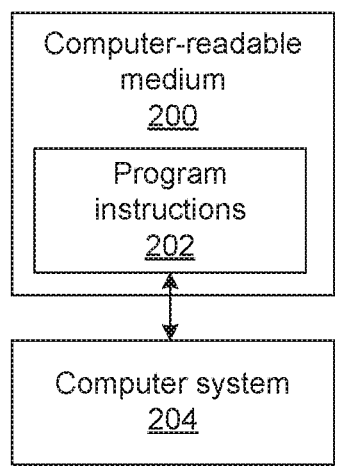
FIG. 2 is a block diagram illustrating one embodiment of a non-transitory computer-readable medium storing program instructions for causing a computer system to perform a computer-implemented method described herein.

An additional embodiment relates to a non-transitory computer-readable medium storing program instructions executable on a computer system for performing a computer-implemented method for selecting one or more modes for inspection of specimens. One such embodiment is shown in FIG. 2. In particular, as shown in FIG. 2, non-transitory computer-readable medium 200 includes program instructions 202 executable on computer system 204. The computer-implemented method may include any step(s) of any method(s) described herein.

Program instructions 202 implementing methods such as those described herein may be stored on computer-readable medium 200. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC") SSE (Streaming SIMD Extension) or other technologies or methodologies, as desired.

Computer system 204 may be configured according to any of the embodiments described herein.

Further modifications and alternative embodiments of various aspects of the invention will be apparent to those skilled in the art in view of this description. For example, methods and systems for selecting one or more modes for inspection of specimens are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain attributes of the invention may be utilized independently, all as would be apparent to one skilled in the art after having the benefit of this description of the invention. Changes may be made in the elements described herein without departing from the spirit and scope of the invention as described in the following to claims.

What is claimed is:

1. A system configured for selecting one or more modes for inspection of specimens, comprising:
one or more computer systems configured for:
statistically predicting if data points in a set correspond to defects or nuisances on a specimen, wherein the data points comprise one or more attributes determined for discrete locations on the specimen from output generated by two or more modes of an inspection system, and wherein events have been detected at the discrete locations with at least one of the two or more modes;
determining a quantitative measure for each of two or more different combinations of the two or more modes thereby determining different quantitative measures, wherein the quantitative measure for each of the two or more different combinations is responsive to how well one of the two or more different combinations detects the defects and minimizes detection of the nuisances; and
selecting one or more of the two or more modes of the inspection system for inspection of specimens of the same type as the specimen based on the determined quantitative measures.

2. The system of claim 1, wherein the statistically predicting comprises fitting a density function to an entirety of the data points, determining a density value for each of two or more of the data points thereby determining density values for the data points, wherein the density values estimate a chance that the data points correspond to the nuisances, and determining an information gain score that measures a change in entropy if the data points are split in two based on a threshold.

3. The system of claim 2, wherein the statistically predicting, determining the quantitative measure, and selecting the one or more modes are unsupervised.

4. The system of claim 2, wherein determining the quantitative measure comprises assigning a ranking to each of the two or more different combinations by comparing the information gain scores determined for each of the two or more different combinations, and wherein the rankings are assigned such that higher rankings correspond to higher information gain scores.

5. The system of claim 4, wherein determining the quantitative measure further comprises determining one or more performance characteristics of a predetermined number of the two or more different combinations assigned the highest rankings, and wherein the determined quantitative measures upon which the selecting is based comprise the determined one or more performance characteristics.

6. The system of claim 5, wherein determining the one or more performance characteristics comprises generating a receiver operating characteristic curve for each of the predetermined number of the two or more different combinations and determining an average defect of interest retention over a range of nuisance reduction percentages from the receiver operating characteristic curve for each of the predetermined number of the two or more different combinations, and wherein the determined one or more performance characteristics upon which the selecting is based comprise the determined average defect of interest retentions.

7. The system of claim 1, wherein the statistically predicting comprises inputting the data points into a random forest decision tree configured for separating the data points into two or more regions and assigning classes to the data points based on the most commonly occurring classes of training samples separated into the two or more regions.

8. The system of claim 7, wherein the statistically predicting, determining the quantitative measure, and selecting the one or more modes are supervised.

9. The system of claim 7, wherein the two or more regions are non-overlapping regions defined by different, non-overlapping ranges of values for the one or more attributes determined for the discrete locations.

10. The system of claim 7, wherein the one or more computer systems are further configured for creating initial random forest decision trees using bootstrapped training samples, decorrelating the initial random forest decision trees by choosing a random subset of attributes determined for the bootstrapped training samples each time a split is considered, and selecting one of the attributes in the random subset that best separates the classes for use thereby determining the random forest decision tree.

11. The system of claim 7, wherein the random forest decision tree is further configured to use an ensemble learning based technique.

12. The system of claim 7, wherein determining the quantitative measure comprises generating a receiver operating characteristic curve for each of the two or more different combinations and determining an average defect of interest retention over a range of nuisance reduction percentages from the receiver operating characteristic curve for each of the two or more different combinations, and wherein the determined quantitative measures upon which the selecting is based comprise the determined average defect of interest retentions.

13. The system of claim 7, wherein the random forest decision tree is further configured for using only a first portion of the data points during bootstrapping, and wherein the statistically predicting further comprises inputting a second portion of the data points into the random forest decision tree, determining an out of bag error for the results produced by the random forest decision tree for the second portion of the data points, and determining a probability value that each of the data points are defects of interest using the out of bag error.

14. The system of claim 13, wherein determining the quantitative measure comprises generating a receiver operating characteristic curve for each of the two or more different combinations and determining an average retention of the defects of interest over a range of nuisance reduction percentages from the receiver operating characteristic curve for each of the two or more different combinations, and wherein the determined quantitative measures upon which the selecting is based comprise the determined average defect of interest retentions.

15. The system of claim 1, wherein the one or more computer systems are further configured for storing information for the selected one or more modes for use in an inspection process performed on the specimens by the inspection system.

16. The system of claim 1, further comprising the inspection system coupled to the one or more computer systems.

17. The system of claim 1, wherein the inspection system is configured as a light-based inspection system.

18. The system of claim 1, wherein the inspection system is configured as an electron beam based inspection system.

19. A non-transitory computer-readable medium, storing program instructions executable on a computer system for performing a computer-implemented method for selecting one or more modes for inspection of specimens, wherein the computer-implemented method comprises:

statistically predicting if data points in a set correspond to defects or nuisances on a specimen, wherein the data points comprise one or more attributes determined for discrete locations on the specimen from output generated by two or more modes of an inspection system, and wherein events have been detected at the discrete locations with at least one of the two or more modes;

determining a quantitative measure for each of two or more different combinations of the two or more modes thereby determining different quantitative measures, wherein the quantitative measure for each of the two or more different combinations is responsive to how well one of the two or more different combinations detects the defects and minimizes detection of the nuisances; and selecting one or more of the two or more modes of the inspection system for inspection of specimens of the same type as the specimen based on the determined quantitative measures, wherein said statistically predicting, determining, and selecting are performed by the computer system.

20. A method for selecting one or more modes for inspection of specimens, comprising:

statistically predicting if data points in a set correspond to defects or nuisances on a specimen, wherein the data points comprise one or more attributes determined for discrete locations on the specimen from output generated by two or more modes of an inspection system, and wherein events have been detected at the discrete locations with at least one of the two or more modes;

determining a quantitative measure for each of two or more different combinations of the two or more modes thereby determining different quantitative measures, wherein the quantitative measure for each of the two or more different combinations is responsive to how well one of the two or more different combinations detects the defects and minimizes detection of the nuisances; and selecting one or more of the two or more modes of the inspection system for inspection of specimens of the same type as the specimen based on the determined quantitative measures, wherein said statistically predicting, determining, and selecting are performed by one or more computer systems.

\* \* \* \* \*